US009768337B2

(12) United States Patent
de Ceglia et al.

(10) Patent No.: US 9,768,337 B2
(45) Date of Patent: Sep. 19, 2017

(54) PHOTONIC BANDGAP STRUCTURE

(71) Applicant: The United States of America as Represented by the Secretary of the Army, Washington, DC (US)

(72) Inventors: Domenico de Ceglia, Huntsville, AL (US); Maria Antonietta Vincenti, Huntsville, AL (US); Michael Scalora, Huntsville, AL (US); Mirko Giuseppe Cappeddu, Catania (IT)

(73) Assignee: The United States of America as represented by the Secretary of the Army, Washington, DC (US)

( * ) Notice: Subject to any disclaimer, the term of this patent is extended or adjusted under 35 U.S.C. 154(b) by 104 days.

(21) Appl. No.: 14/673,370

(22) Filed: Mar. 30, 2015

(65) Prior Publication Data

US 2015/0364634 A1 Dec. 17, 2015

Related U.S. Application Data

(62) Division of application No. 13/248,716, filed on Sep. 29, 2011, now Pat. No. 8,993,874.

(60) Provisional application No. 61/499,915, filed on Jun. 22, 2011.

(51) Int. Cl.
*H01L 31/0687* (2012.01)
*H01L 31/0693* (2012.01)
*H01L 31/056* (2014.01)

(52) U.S. Cl.
CPC ........ *H01L 31/0687* (2013.01); *H01L 31/056* (2014.12); *H01L 31/0693* (2013.01); *Y02E 10/52* (2013.01); *Y02E 10/544* (2013.01)

(58) Field of Classification Search
CPC ............. H01L 31/0687; H01L 31/0693; H01L 31/0735
See application file for complete search history.

(56) References Cited

U.S. PATENT DOCUMENTS

| 5,799,028 | A | * | 8/1998 | Geels | ...................... H01L 33/44 372/49.01 |
|---|---|---|---|---|---|
| 2002/0144725 | A1 | * | 10/2002 | Jordan | .............. H01L 31/02167 136/247 |
| 2004/0200523 | A1 | | 10/2004 | King et al. | |
| 2006/0226508 | A1 | * | 10/2006 | Park | .................... H01L 23/5256 257/529 |
| 2007/0131276 | A1 | | 6/2007 | Nee | |
| 2008/0070334 | A1 | | 3/2008 | Krames et al. | |
| 2008/0135086 | A1 | | 6/2008 | Corrales | |

(Continued)

OTHER PUBLICATIONS

Scalora et al., Transparent, Metallo-Dielectric, One-Dimensional, Photonic Band-Gap Structures, J. Appl. Phys., vol. 83, No. 5, pp. 2377-2383, (Mar. 1, 1998).

*Primary Examiner* — Bethany L Martin
(74) *Attorney, Agent, or Firm* — Michael K. Gray

(57) ABSTRACT

A photonic bandgap structure having multiple stacked layers has a thickness from the top of its top layer to the bottom of its bottom layer of less than one micron. Metal conducting layers having negative real dielectric constants are positioned between semiconductor layers having positive dielectric constants. The layers are arranged and stacked, and the thicknesses and materials for the semiconductor layers and conductive layers are selected to realize desired absorption, transmission, and reflection characteristics.

8 Claims, 20 Drawing Sheets

(56) References Cited

U.S. PATENT DOCUMENTS

2008/0216885 A1     9/2008   Frolov et al.
2009/0211622 A1     8/2009   Frolov et al.
2010/0084924 A1*    4/2010   Frolov .............. H01L 31/02021
                                                              307/82
2011/0297213 A1    12/2011   Tsutagawa
2012/0090672 A1*    4/2012   Lebby ................... H01L 31/072
                                                              136/255

* cited by examiner

PHOTONIC BANDGAP STRUCTURE

CROSS-REFERENCE TO RELATED APPLICATIONS

This is a divisional of U.S. patent application Ser. No. 13/248,716 filed on Sep. 29, 2011 and published on Dec. 27, 2012 which claimed benefit of provisional application No. 61/499,915 filed on Jun. 22, 2011. The aforementioned patent applications are herein incorporated by reference.

STATEMENT REGARDING FEDERALLY SPONSORED RESEARCH OR DEVELOPMENT

This invention was made with Government support under DARPA contract no. W31P4Q-11-C-0237. All the inventors have assigned their rights in the invention to the Government. As such this invention may be manufactured, used, and licensed by or for the U.S. Government for governmental purposes without the payment of royalties thereon.

BACKGROUND OF THE INVENTION

Embodiments described in the present disclosure relate generally to the field of solar cells and conversion of light energy into electrical energy with photonic bandgap structures.

In the field of solar panel cells it is desired that solar light be absorbed efficiently by a material, and converted into charge carriers that may generate an electrical current (photocurrent). Solar cells use a photon absorption process where an incoming photon generates charge carriers such as an electron-hole pair in the material. The photo-generated electron-hole pair may be converted into a photocurrent by applying an electric field separating the charge carriers in conducting elements.

This is a desirable outcome of a photo-generated electron-hole pair in a solar cell. Alternatively, the photo-generated electron-hole pair may recombine, emitting a second photon at the same or slightly different wavelength. The second photon may then escape the structure. Also, the photon-generated electron-hole pair may be trapped in the material by impurities and other defects, without generating a photocurrent. Further, scattering events in impurities and other defects may deplete the energy of the photo-generated electron-hole pairs, so that these may recombine, generating excess heat and unable to produce a photocurrent.

Current solar panel cell applications rely on amorphous silicon or similar bulk structures in order to optimize the conversion of absorbed photons into a photocurrent. Amorphous structures facilitate the re-absorption of photons that are re-emitted within the structure, increasing the charge carrier generation. However, amorphous materials have the problem of inefficient coupling of the generated charge carriers into a photocurrent, through an electric field. Thus, prior art applications of solar cells use complicated structures involving highly doped semiconductor regions next to Schottky barrier metals. Furthermore, in order to increase the amount of generated charge carriers, some technologies choose to use thicker slabs of materials. This increases the probability of trapping charge carriers in material defects before being coupled to a current flow out of the structure, thereby reducing photocurrent generation efficiency.

Current solar panel technologies present problems such as wear out, damage, and stress introduced in the structure by heating. Damage and heating in a solar panel is produced by absorption of the high content of ultraviolet (UV) and infrared radiation (IR) from the sun. Also, solar panel technologies face the problem that the efficiency of the photocurrent generation is highly dependent on the angle of incidence of radiation.

The sun provides radiation at variable angular orientations throughout the day. Thus, current technologies need to devise complicated mechanisms and architectures to compensate for the change in efficiency throughout the day.

Therefore, there is a need for solar panel cells that have increased efficiency for photocurrent generation. It is desirable that UV and IR radiation either be reflected by the solar panel cells to avoid damage to the structure or absorbed in materials having the appropriate band gaps to convert the radiation in photocurrent. It is also desired that the efficiency of the current generation process be equally high for all possible incidence angles of the radiation upon the solar panel. Current solar panel technology uses tracking devices to overcome this issue.

SUMMARY OF THE INVENTION

According to embodiments disclosed herein a photovoltaic cell for use in a solar cell panel includes a plurality of layers of a first material having a first thickness and a first optical characteristic; a plurality of layers of a second material having a second thickness and a second optical characteristic, each of the plurality of layers of the first material adjacent to two of the plurality of layers of the second material; wherein the second material includes a metal. In one form, the first material is a semiconductor. In a further aspect, the type of metal remains the same for each layer of the second material, while the first material include more than one semiconductor with a first semiconductor material used to form at least one layer and a different semiconductor material used to form a different layer.

Further according to embodiments disclosed herein a method of forming a photovoltaic cell for use in a solar cell panel includes forming a plurality of layers of a first material having a first thickness and a first optical characteristic; forming a plurality of layers of a second material having a second thickness and a second optical characteristic, such that each of the plurality of layers of the first material is adjacent to two of the plurality of layers of the first material; wherein the second material includes a metal.

These and other embodiments are further described below with reference to the following figures.

DETAILED DESCRIPTION

A photovoltaic cell to convert light energy into electrical energy according to embodiments disclosed herein includes a juxtaposition of metallic and properly doped semiconductor layers. As illustrated in some embodiments, relatively thin dielectric layers may be embedded between a metal layer and a semiconductor layer to increase the open circuit voltage (Voc). The resulting multilayer stack absorbs the part of electromagnetic spectrum that is efficiently converted into electric energy by the semiconductor layers and, at the same time, reflects back the other parts of the spectrum that may cause overheating of the cell (for example near infrared radiation) and are generally detrimental to the overall conversion efficiency. The geometrical parameters of the multilayer, as well as the optical properties of the materials composing the stack, can be used to control absorption, reflection, and transmission spectra using design criteria similar to those exploited in photonic band gap (PBG) structures.

The metallic layers play a two-fold role in device operation: (i) from an optical point of view the metal regions act as mirrors, thus providing multiple reflections, slow light effects, field amplitude enhancement, and enhancement of absorption of electromagnetic energy propagating through the structure; (ii) from an electrical point of view, the metallic layers can be used as a network of electrodes distributed along the entire structure.

Figure 1A:
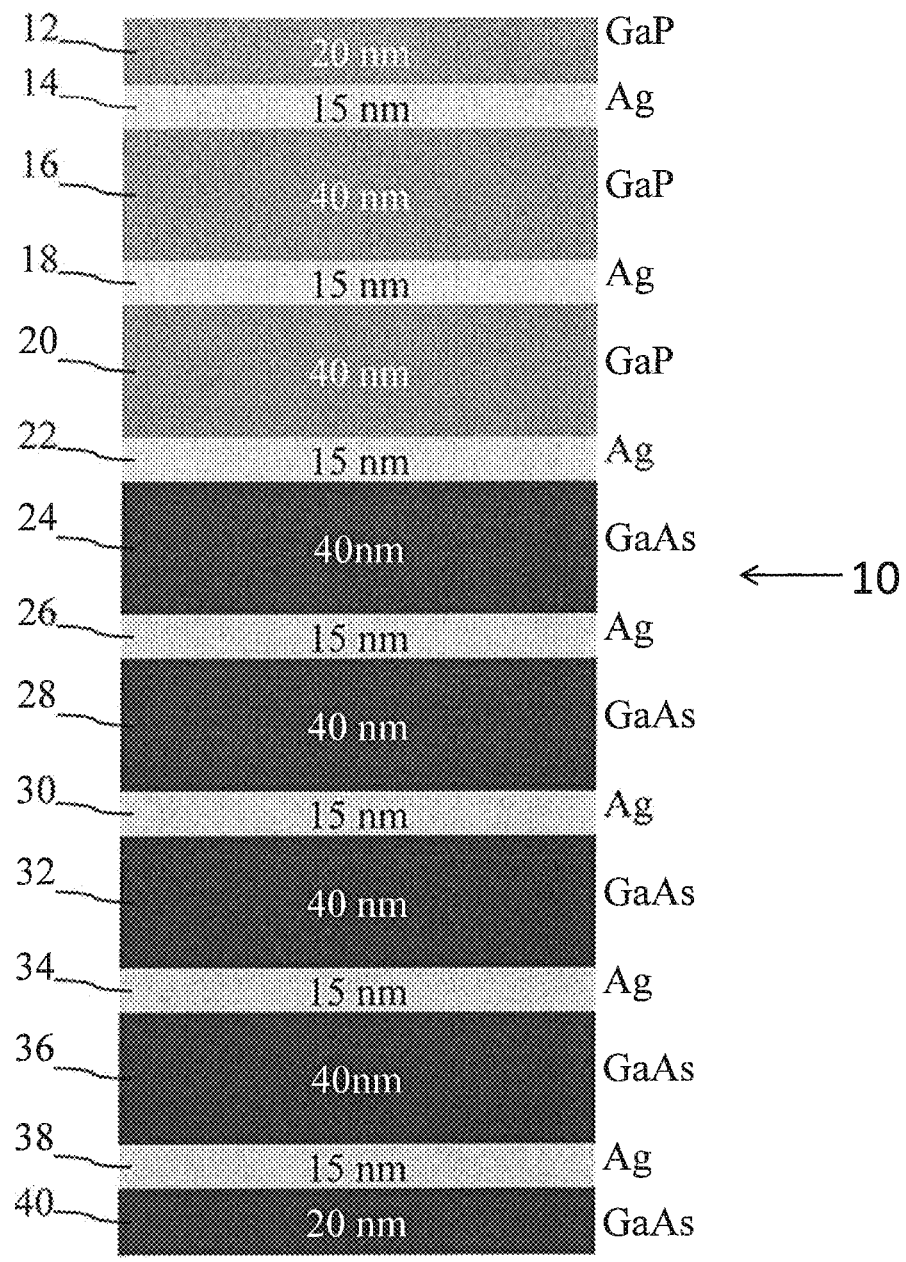
FIG. 1A shows a partial view of a photonic bandgap solar cell according to some embodiments.

FIG. 1A shows a partial view of a photonic bandgap solar cell according to some embodiments. In the embodiment depicted in FIG. 1A, a semitransparent metal-semiconductor solar cell is depicted. The multilayer structure of FIG. 1A includes a combination of properly doped semiconductor layers made of GaAs and GaP having thicknesses of 20 nm and 40 nm, intercalated with thin metal layers of silver (Ag), of 15 nm thickness each. FIG. 1A includes a first layer of GaP having a 20 nm thickness placed on top of two more layers of GaP of 40 nm thickness. Four layers of GaP, each having a thickness of 40 nm, are placed below the GaAs layers, and a 20 nm GaAs layer is at the bottom of the structure. Each of the semiconductor layers are separated from each other by a 15 nm layer of Ag. The structure shown in FIG. 1A has seven (7) layers of Ag, thus having a total thickness of 105 nm of Ag.

In FIG. 1A, the top layer of the photovoltaic cell 10 is a first semiconductor layer 12 made of GaP. First semiconductor layer 12 is 20 nm thick. Located below and contacting first semiconductor layer 12 is first metal conducting layer 14 made of silver (Ag) and having a thickness of 15 nm. Located below and contacting first metal conducting layer 14 is a second semiconductor layer 16 made of GaP and having a thickness of 40 nm. Located below and contacting second semiconductor layer 16 is a second metal conducting layer 18 made of silver and having a thickness of 15 nm. Located below and contacting second metal conducting layer 18 is a third semiconductor layer 20 made of GaP and having a thickness of 40 nm.

Located below and contacting the third semiconductor layer 20 is a third metal conducting layer 22 made of silver and having a thickness of 15 nm. Located below and contacting the third metal conducting layer 22 is a fourth semiconductor layer 24 made of GaAs and having a thickness of 40 nm. Located below and contacting the fourth semiconductor layer 24 is a fourth metal conducting layer 26 made of silver and having a thickness of 15 nm. Located below and contacting the fourth metal conducting layer 26 is a fifth semiconductor layer 28 made of GaAs and having a thickness of 40 nm.

Located below and contacting the fifth semiconductor layer 28 is a fifth metal conducting layer 30 made of silver and having a thickness of 15 nm. Located below and contacting the fifth metal conducting layer 30 is a sixth semiconductor layer 32 made of GaAs and having a thickness of 40 nm. Located below and contacting the sixth semiconductor layer 32 is a sixth metal conducting layer 34 made of silver and having a thickness of 15 nm. Located below and contacting the sixth metal conducting layer 34 is a seventh semiconductor layer 36 made of GaAs and having a thickness of 40 nm. Located below and contacting the seventh semiconductor layer 36 is a seventh metal conducting layer 38 made of silver and having a thickness of 15 nm. Located below and contacting the seventh metal conducting layer 38 is the bottom layer of the photovoltaic cell 10 which is an eighth semiconductor layer 40 made of GaAs having a thickness of 20 nm.

According to embodiments consistent with FIG. 1A different band-gap semiconductor layers are included. The bandgap of GaP at a temperature of 300 K is approximately 2.26 eV, and the bandgap of GaAs at 300 K is approximately 1.42 eV. In the case of the structure depicted in FIG. 1A, the higher energy bandgap semiconductor layers (GaP) are placed in the upper portion of the solar cell. Here, the upper portion of the cell includes the first material layers encountered by solar radiation as it impinges on the cell, regardless of the specific cell orientation. According to FIG. 1A, the lower energy bandgap semiconductor layers (GaAs) are placed in a lower portion of the solar cell relative to the incidence of the solar radiation.

Several parameters are of relevance in the design of a multilayered stack as depicted in FIG. 1A. The absorption coefficient of the different layers is important to determine the absorption spectrum of the overall structure. Furthermore, the index of refraction and thickness of each of the layers will determine the precise distribution of the optical field inside the structure, for a given wavelength. This may be obtained through the same phenomenon giving rise to a photonic bandgap structure, as described in detail in the paper by M. Scalora et al., "Transparent, metallo-dielectric, one-dimensional, photonic band-gap structures," J. Appl. Phys. 83(5), 2377 (1998), incorporated herein by reference in its entirety. Thus, a configuration may be designed such that for wavelengths in the visible spectral region optical waves are generated having a maximum intensity in the semiconductor layers, where absorption occurs. Using the principles of photonic bandgap structures, a low propagation speed through the structure for light having a wavelength in the visible spectrum may increase absorption in the semiconductor layers.

The electron-hole pairs generated in the semiconductors are separated by Schottky junctions located at the metal-semiconductor interfaces and they are collected through an electrode network formed by the metal layers. The total thickness of the proposed solar cells is of the order of visible wavelengths (less than one micron) and conversion efficiencies are relatively independent of incident angle and polarization. For example, the total thickness of a solar cell structure as shown in FIG. 1A is about 385 nm, which is below the wavelength range of visible light. Fabrication techniques for a planar multilayer structure such as shown in FIG. 1A are well established and relatively cheap. These characteristics make embodiments consistent with FIG. 1A ideal candidates for portable, lightweight and flexible solar cell technology.

Transmission, reflection and absorption of incident light as a function of wavelength are useful for the analysis of the performance of a multilayered structure such as described in embodiments of the present disclosure. Light impinging on a solar cell may have any angle of incidence. For example, normal incidence corresponds to light propagating in a direction perpendicular to the plane of the solar cell. In normal incidence, the response of the solar cell in terms of transmission, reflection and absorbance of the light is independent of the state of polarization. The solar cell presents a plane in which either of two mutually orthogonal polarization states are equivalent, in normal incidence. For light impinging on a solar cell at an oblique angle, an angle other than perpendicular, two polarization states may be distinguished to characterize solar cell performance. To describe the two polarization states the normal to the surface at the point of incidence and the propagation direction define the plane of incidence of radiation.

A p-polarization state has a linear polarization vector included in the plane of incidence, and an s-polarization state has a linear polarization vector perpendicular to the plane of incidence. The p-polarization vector and the s-polarization vector are both perpendicular to the propagation direction.

Figure 1B:
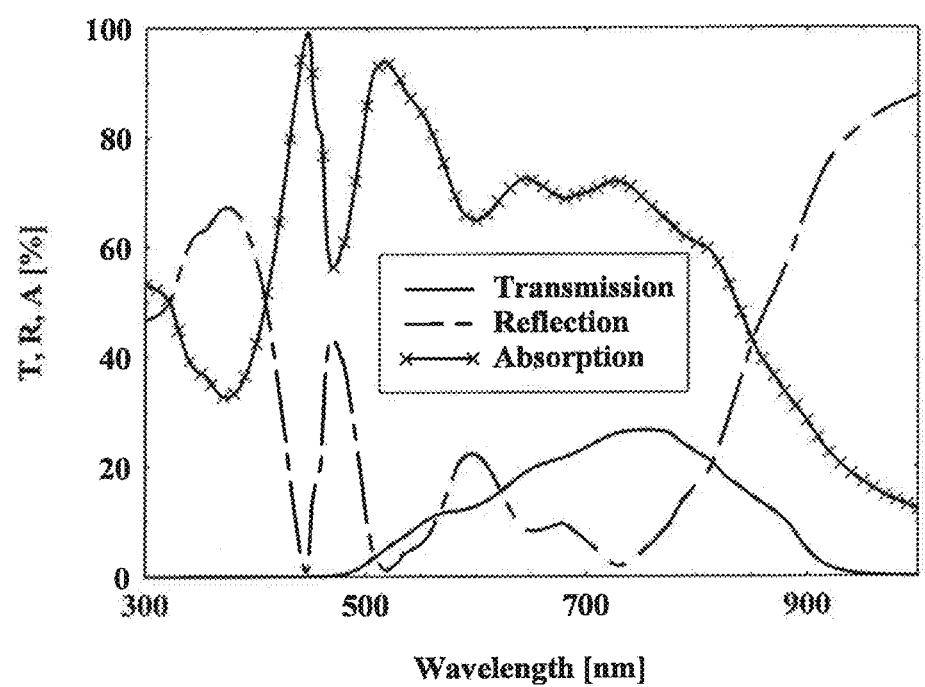
FIG. 1B shows the transmission, reflection, and absorption of light at normal incidence for a photonic bandgap solar cell according to some embodiments.

FIG. 1B shows the transmission, reflection, and absorption of light at normal incidence for a photonic bandgap solar cell according to some embodiments. For example, a solar cell according to the embodiment in FIG. 1A produces a transmission, reflection, and absorption curve as shown in FIG. 1B. A multi-layer stack such as in FIG. 1A absorbs and converts into electricity up to approximately 60% (corresponding to an average absorption in semiconductor layers of .about.40%) of the solar spectrum in the visible range (the (the wavelength range 400 nm-700 nm in FIG. 1B). Also, an average of approximately 20% of the visible light is transmitted.

In other portions of the solar radiation spectrum according to FIG. 1B, the same structure consistent with FIG. 1A reflects approximately 80% of infrared (IR) light and approximately 50% of ultra-violet (UV) light. Thus, a solar cell structure as shown in FIG. 1A provides sufficient transparency in the visible wavelength range to be used for decorative glass applications, while still generating electricity through absorption. For example, architectural windows using a solar cell structure as depicted in FIG. 1A may provide a pleasing esthetic view while generating electricity.

Semi-transparent, wide-band metal-semiconductor structures consistent with the embodiments of FIGS. 1A and 1B, absorbing an average of 60% (corresponding to an average absorption in semiconductor layers of .about.40%) in the visible range and transmitting the rest of the incident light can be used effectively as windows or windshield coatings. The coating may act as an efficient multi junction cell if the metal layers are properly connected to recover the generated current. The optical design of this device may be characterized by: i) an efficient semi-transparent coating or shield sufficiently transparent to allow its use on windows or windshields (T.about.20% across the visible range); ii) optical field localization inside the stack, enhancing the electron-hole pair generation rate of the structure. The electron-hole generation rate competes with the doping of the semiconductors in the determination of the photocurrent. Higher electron-hole generation rates relax the requirement for doping the semiconductor layers, thereby simplifying the overall fabrication process and reducing its cost.

Embodiments consistent with FIGS. 1A and 1B include seven (7) layers of silver stacked together with gallium arsenide (GaAs) and gallium phosphide (GaP) layers to absorb an average of 60% (corresponding to an average absorption in semiconductor layers of .about.40%) in the visible range. An absorption maximum reaches approximately 100% (corresponding to an absorption in semiconductor layers of .about.95%) near 400 nm, on the 'blue' side of the visible spectrum. The different absorption bands of GaAs and GaP can be efficiently overlapped to produce the desired transmission, reflection and absorption rates at different wavelengths. A desirable characteristic of embodiments such as depicted in FIGS. 1A and 1B is the ability to reflect UV, near-IR (800-1000 nm), and IR radiation. Thus, avoiding detrimental heating of the cell and performance deterioration in terms of conversion efficiency, due to environmental conditions. Moreover, if the structure is used as window coating, a spectral characteristic as shown in FIG. 1B avoids also the transmission of IR and UV radiation into an interior environment.

Thus preventing the heating of a room in summertime, and radiation cooling (radiant heat escaping through windows) in wintertime. The same phenomenon occurs when this type of coating is employed as a coating on top of windshields for cars, helicopters or aircraft among other applications. In addition, a photonic band gap solar cell coating or film similar to those described above can be applied to mobile computing devices such as laptops, tablet computers, personal data assistants, media players, and mobile phones. When applied on a screen of such a device, the layers are configured to allow at least 25% transmission of light from the underlying display elements. Such a coating provides UV and IR protection for the device, while simultaneously generating power in the solar cell to power the device.

FIGS. 2A-3C are a series of charts showing transmission, reflection, and absorption properties as a function of the total amount of incident light at various wavelengths incident on the PBG structure over a range of incident angles. Normal incidence corresponds to light propagating in a direction perpendicular to the plane of the solar cell shown by 0 degrees with oblique incidence shown extending up to 90 degrees. The scale of the right side of each chart provides an indication of the amount of light transmitted, reflected or absorbed, respectively, as a portion of the total light incident on the PBG structure.

Figure 2A:
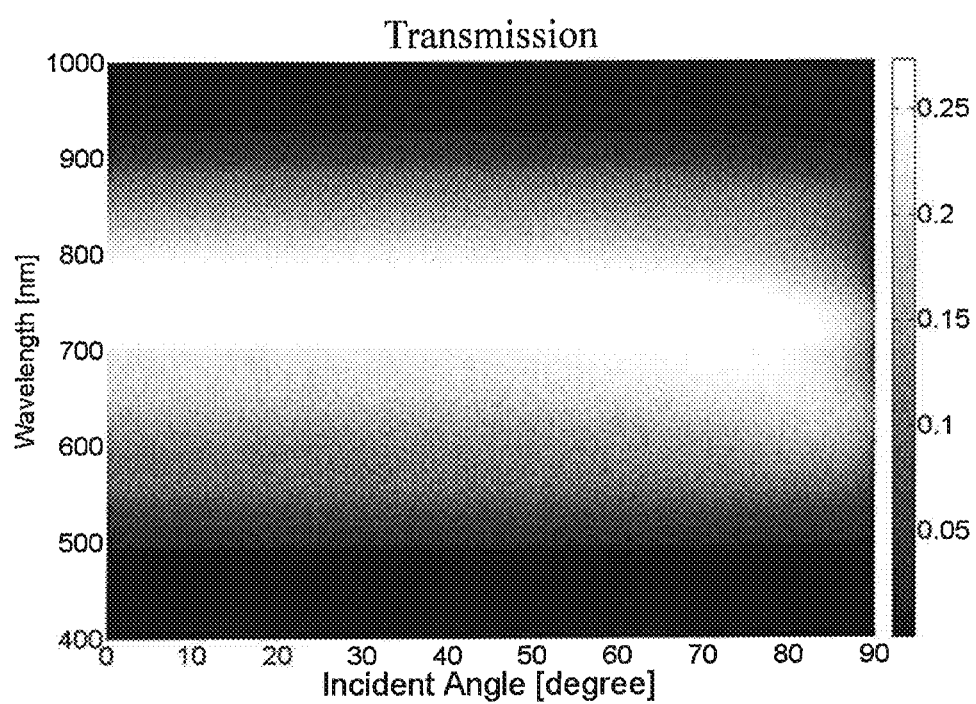
FIG. 2A shows the transmission of p-polarized light for different wavelengths and angles of incidence for a photonic bandgap solar cell according to some embodiments.

FIG. 2A shows transmission of p-polarized light for different wavelengths and angles of incidence for a photonic bandgap solar cell, according to some embodiments. For example, a solar cell according to embodiments consistent with FIG. 1A produces a transmission surface for p-polarized light as shown in FIG. 2A.

Figure 2B:
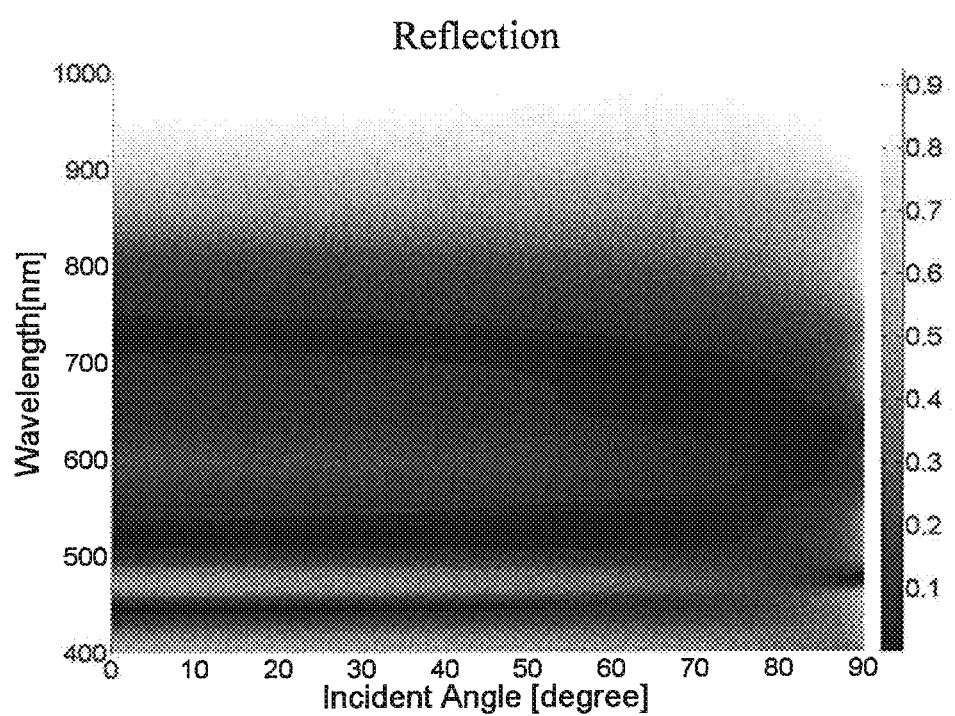
FIG. 2B shows the reflection of p-polarized light for different wavelengths and angles of incidence for a photonic bandgap solar cell according to some embodiments.

FIG. 2B shows the reflection of p-polarized light for different wavelengths and angles of incidence for a photonic bandgap solar cell, according to some embodiments. For example, a solar cell according to embodiments consistent with FIG. 1A produces a reflection surface for p-polarized light as shown in FIG. 2B.

Figure 2C:
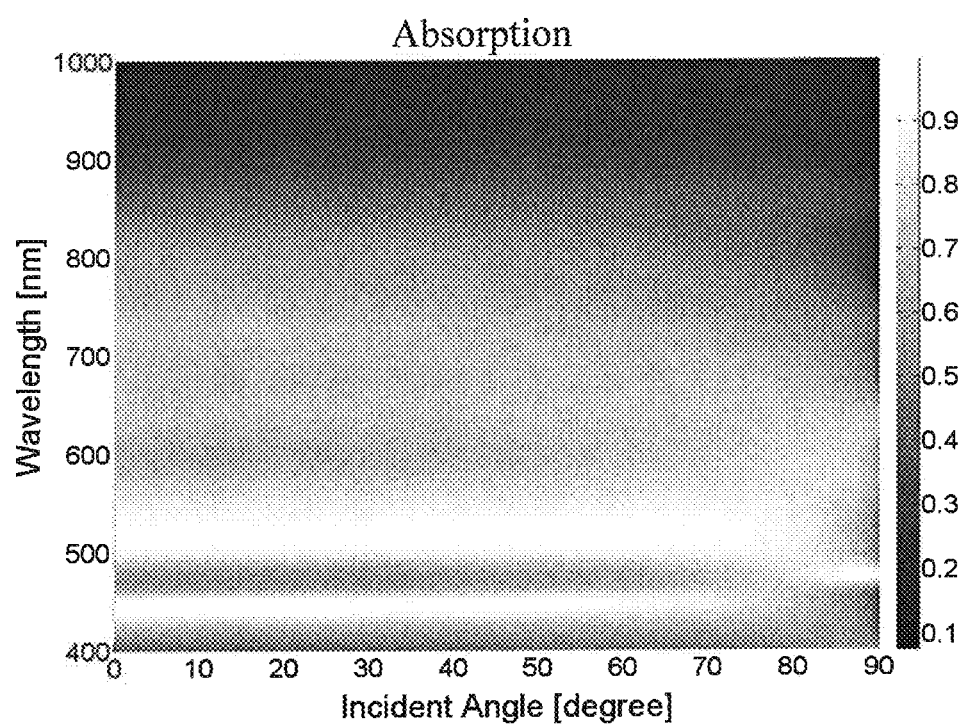
FIG. 2C shows the absorption of p-polarized light for different wavelengths and angles of incidence for a photonic bandgap solar cell according to some embodiments.

FIG. 2C shows the absorption of p-polarized light for different wavelengths and angles of incidence for a photonic bandgap solar cell, according to some embodiments. For example, a solar cell according to embodiments consistent with FIG. 1A produces an absorption surface for p-polarized light as shown in FIG. 2C.

Figure 3A:
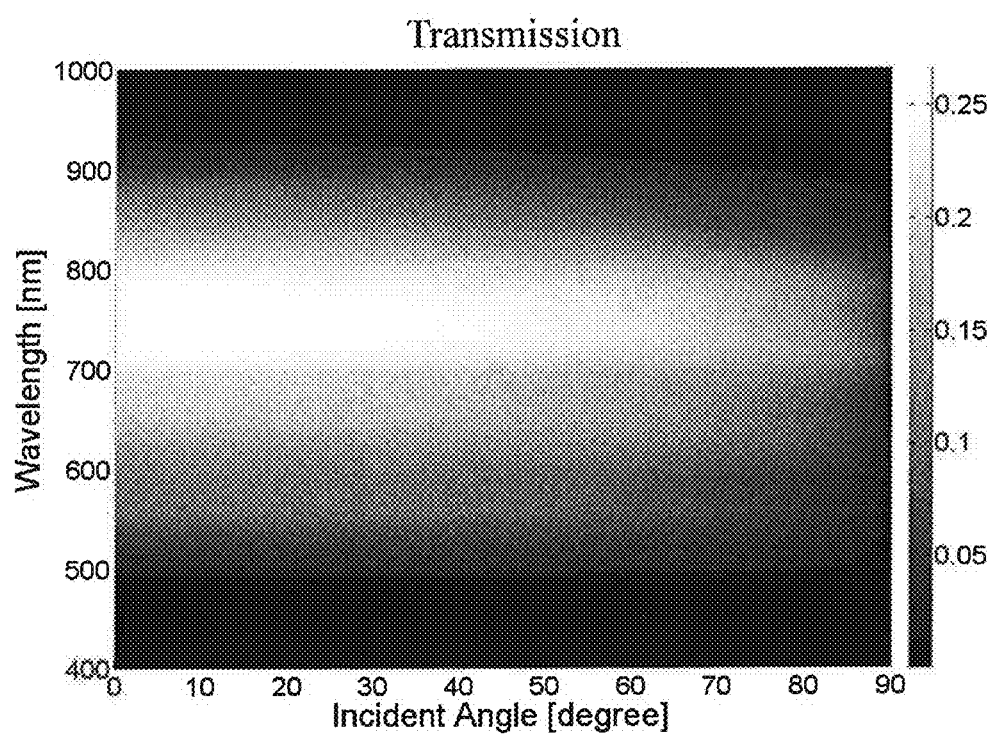
FIG. 3A shows the transmission of s-polarized light for different wavelengths and angles of incidence for a photonic bandgap solar cell according to some embodiments.

FIG. 3A shows the transmission of s-polarized light for different wavelengths and angles of incidence for a photonic bandgap solar cell, according to some embodiments. For example, a solar cell according to embodiments consistent with FIG. 1A produces a transmission surface for s-polarized light as shown in FIG. 3A.

Figure 3B:
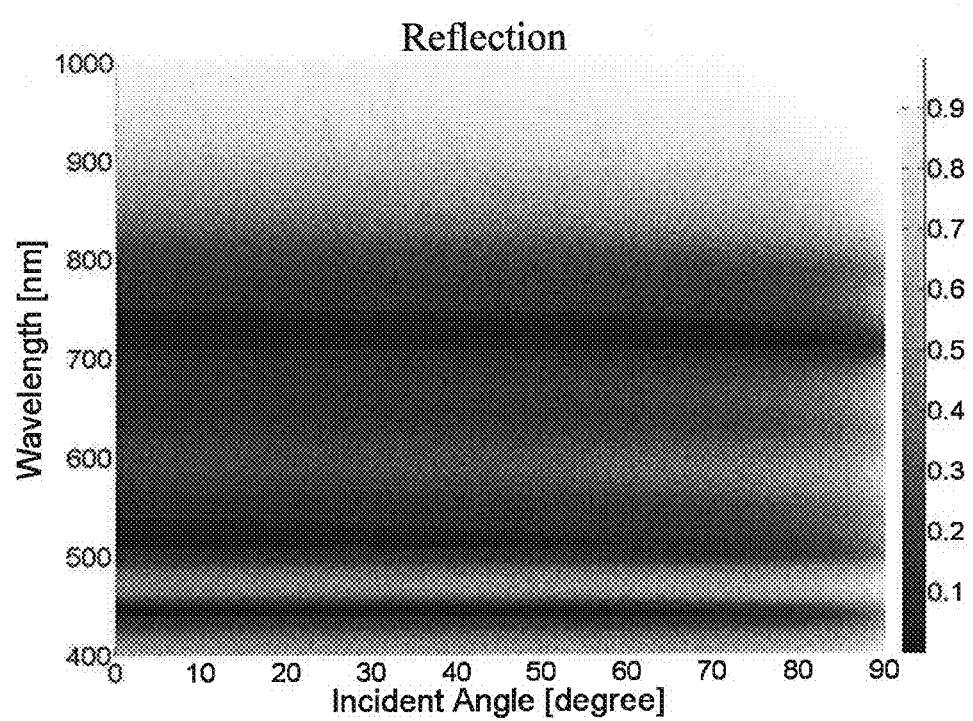
FIG. 3B shows the reflection of s-polarized light for different wavelengths and angles of incidence for a photonic bandgap solar cell according to some embodiments.

FIG. 3B shows the reflection of s-polarized light for different wavelengths and angles of incidence for a photonic bandgap solar cell, according to some embodiments. For example, a solar cell according to embodiments consistent with FIG. 1A produces a transmission surface for s-polarized light as shown in FIG. 3B.

Figure 3C:
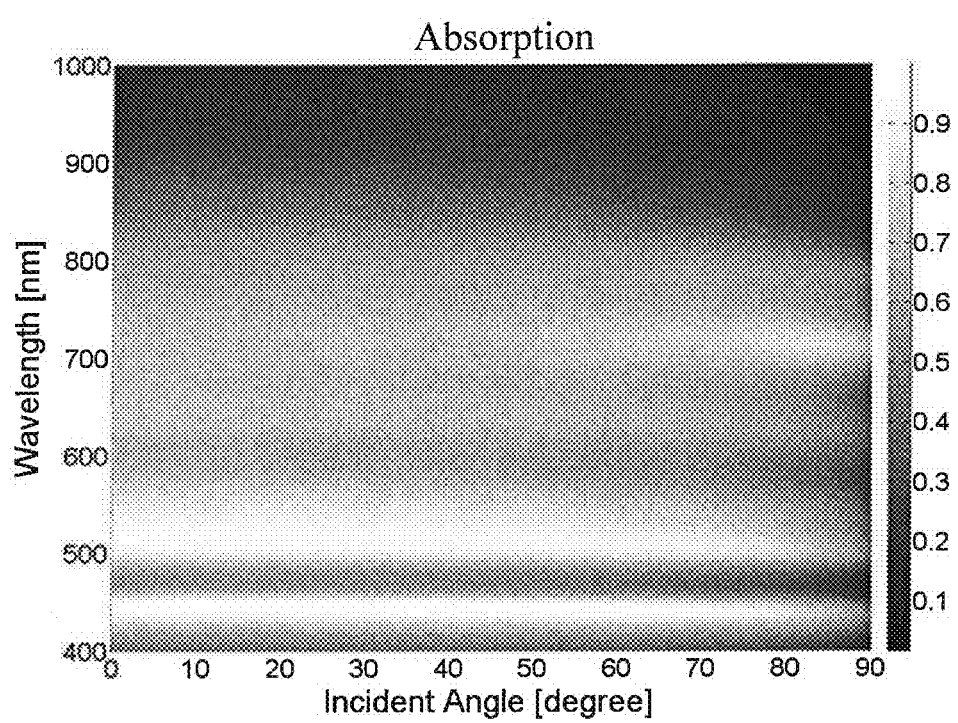
FIG. 3C shows the absorption of s-polarized light for different wavelengths and angles of incidence for a photonic bandgap solar cell according to some embodiments.

FIG. 3C shows the absorption of s-polarized light for different wavelengths and angles of incidence for a photonic bandgap solar cell, according to some embodiments. For example, a solar cell according to embodiments consistent with FIG. 1A produces a transmission surface for s-polarized light as shown in FIG. 3C.

The wavelength range covered in FIGS. 2A-2C is from 400 nm to 1000 nm, and the angle of incidence covered is from 0 to 90 degrees, relative to the normal of the solar cell plane. According to the results shown in FIGS. 2A-2C and FIGS. 3A-3C, embodiments consistent with FIG. 1A present optical properties substantially similar for almost all angles of incidence and for s- and p-polarization states alike. A multilayer structure such as in the embodiment depicted in FIG. 1A has a total thickness of the order of about the wavelength of light targeted for photo-absorption, or less. These structures present substantially similar optical characteristics for a wide range of wavelengths and angles of incidence since diffraction effects within the structure are suppressed. However, since the geometry of the cell is not symmetric with respect to the normal direction, the ordering of the layers is important to obtain a desired optical performance.

For example, in embodiments consistent with FIG. 1A, lower energy bandgap semiconductor layers (GaAs) are placed towards the bottom of the solar cell, away from the point of incidence of the solar radiation. This gives rise to optical performance as depicted in FIGS. 1B, 2A-2C, and 3A-3C. For embodiments consistent with FIG. 1A, light is incident on the GaP side of the solar cell. Note that, according to FIG. 1B, absorption in the UV portion of the spectrum is relatively high, thus exploiting the UV portion of the spectrum to generate a photocurrent. Also according to FIG. 1B, UV radiation is strongly suppressed in transmission, making a solar cell as in FIG. 1A useful in applications where UV protection is desirable. Such applications include eye protection devices, window screens, and others.

Figure 4A:
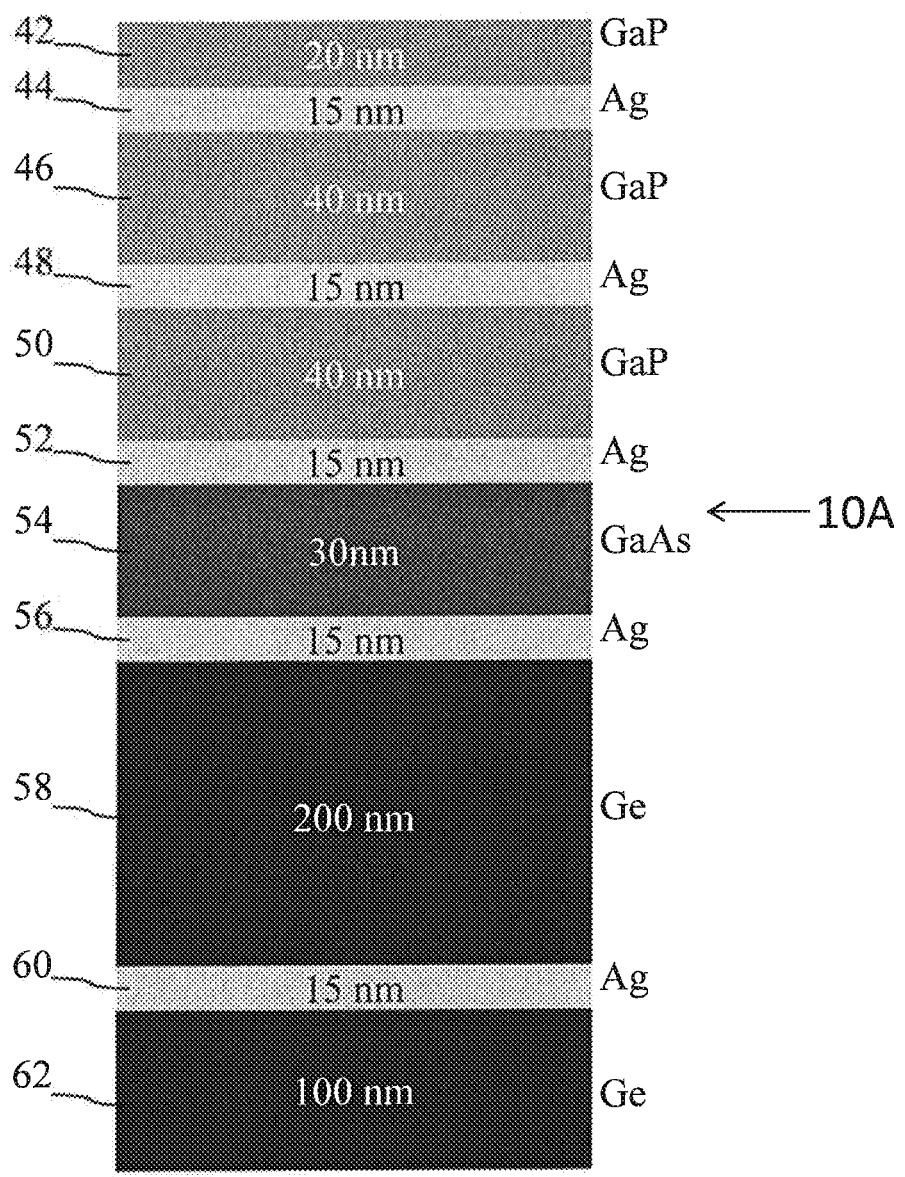
FIG. 4A shows a partial view of a photonic bandgap solar cell according to some embodiments.

FIG. 4A shows a partial view of a photonic bandgap solar cell, according to some embodiments. In this embodiment the multilayer is designed as a wideband solar cell. This structure supports high field localization in the semiconductor layers favored by the creation of Fabry-Perot resonances. In order to absorb the widest possible spectrum the structure includes different types of semiconductors so that the cell can selectively absorb solar light by exploiting different band-gap materials. Embodiments consistent with FIG. 4A are obtained by alternating five (5) silver (Ag) layers each 15 nm thick with semiconductors (GaP, GaAs and Ge) having different band gaps. The structure has a total thickness of 505 nm. It is worth noting that the incident side according to embodiments consistent with FIG. 4A is the one with the higher energy bandgap semiconductor (GaP). The configuration in FIG. 4A results in wide optical absorption across the visible part of the spectrum.

In embodiments consistent with FIG. 4A the different semiconductor layers are arranged so that high-energy photons (typically UV and visible light) are absorbed by large-band-gap semiconductors or other appropriately doped dielectric material on the upper part of the cell. As solar radiation traverses through a multilayered structure such as shown in FIG. 4A higher-energy photons (shorter wavelength, at the blue portion of the spectrum) are absorbed and depleted from the propagating radiation first. Lower-energy photons (toward the red portion of the spectrum) are absorbed in small-band-gap semiconductor layers located on the bottom part of the cell. This arrangement of the semiconductor layers optimizes the absorption efficiency of the structure. While absorption capacity of the small-band-gap layers is dedicated to longer wavelengths, shorter wavelengths are absorbed more efficiently by larger bandgap layers in early stages of propagation through the solar cell. The result is a highly absorptive structure having very low transmission, as will be described below in relation to FIG. 4B.

In FIG. 4A, the top layer of the photovoltaic cell 10A is a first semiconductor layer 42 made of GaP. First semiconductor layer 42 is 20 nm thick. Located below and contacting first semiconductor layer 42 is first metal conducting layer 44 made of silver (Ag) and having a thickness of 15 nm. located below and contacting first metal conducting layer 44 is a second semiconductor layer 46 made of GaP and having a thickness of 40 nm. Located below and contacting second semiconductor layer 46 is a second metal conducting layer 48 made of silver and having a thickness of 15 nm. Located below and contacting second metal conducting layer 48 is a third semiconductor layer 50 made of GaP and having a thickness of 40 nm.

Located below and contacting the third semiconductor layer 50 is a third metal conducting layer 52 made of silver and having a thickness of 15 nm. Located below and contacting the third metal conducting layer 52 is a fourth semiconductor layer 54 made of GaAs and having a thickness of 30 nm. Located below and contacting the fourth semiconductor layer 54 is a fourth metal conducting layer 56 made of silver and having a thickness of 15 nm. Located below and contacting the fourth metal conducting layer 56 is a fifth semiconductor layer 58 made of Ge and having a thickness of 200 nm. Located below and contacting the fifth semiconductor layer 58 is a fifth metal conducting layer 60 made of silver and having a thickness of 15 nm. Located below and contacting the fifth metal conducting layer 60 is a bottom layer of the photovoltaic cell 10A. The bottom layer is a sixth semiconductor layer 62 made of GaAs and having a thickness of 100 nm.

Figure 4B:
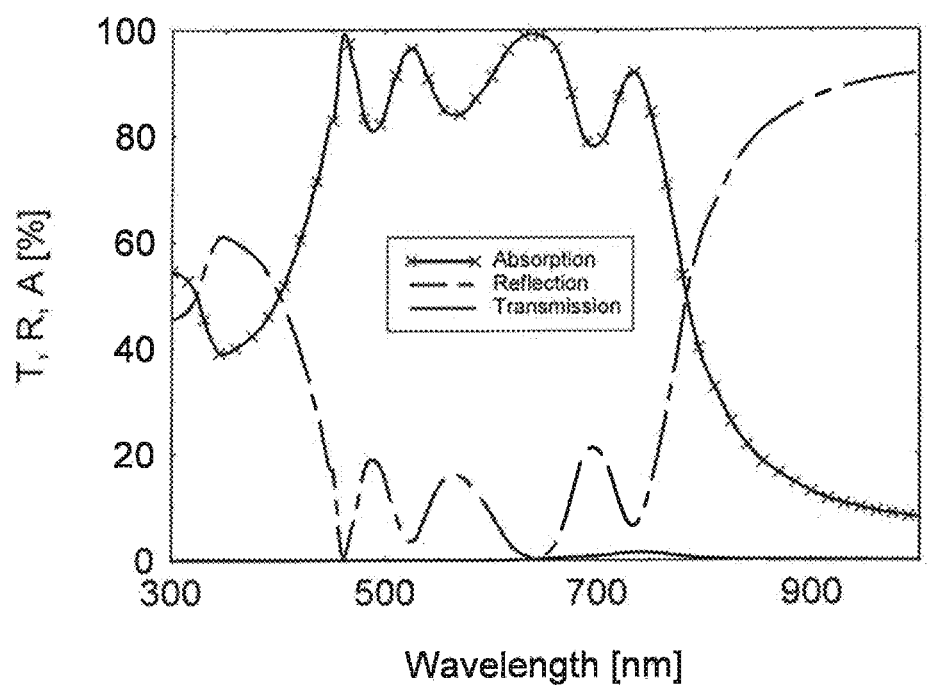
FIG. 4B shows the transmission, reflection, and absorption of light at normal incidence for a photonic gap solar cell, according to some embodiments.

FIG. 4B shows the transmission, reflection, and absorption of light at normal incidence for a photonic bandgap solar cell according to some embodiments. For example, a solar cell according to embodiments consistent with FIG. 4A produces a transmission, reflection, and absorption curve as shown in FIG. 4B. Note that the average transmission across the visible range at normal incidence is almost 0%, while the average absorption is .about.90% (corresponding to an average absorption in semiconductor layers of 70%), and reflection is .about.10%. Moreover this structure reflects substantially all NIR and IR radiation, preventing excessive, detrimental heating of the structure. In embodiments consistent with FIGS. 4A and 4B, the multilayer is designed to maximize light absorption to an average of approximately 90% of the visible light, reflecting an average of approximately 80% of IR light and an average of approximately 50% of UV radiation. This type of embodiment may be more appropriate for roof-tops or other areas with similar functionality.

FIGS. 5A-6C are a series of charts showing transmission, reflection, and absorption properties as a function of the total amount of incident light at various wavelengths incident on the PBG structure over a range of incident angles. The scale of the right side of each chart provides an indication of the amount of light transmitted, reflected or absorbed, respectively, as a portion of the total light incident on the PBG structure.

Figure 5A:
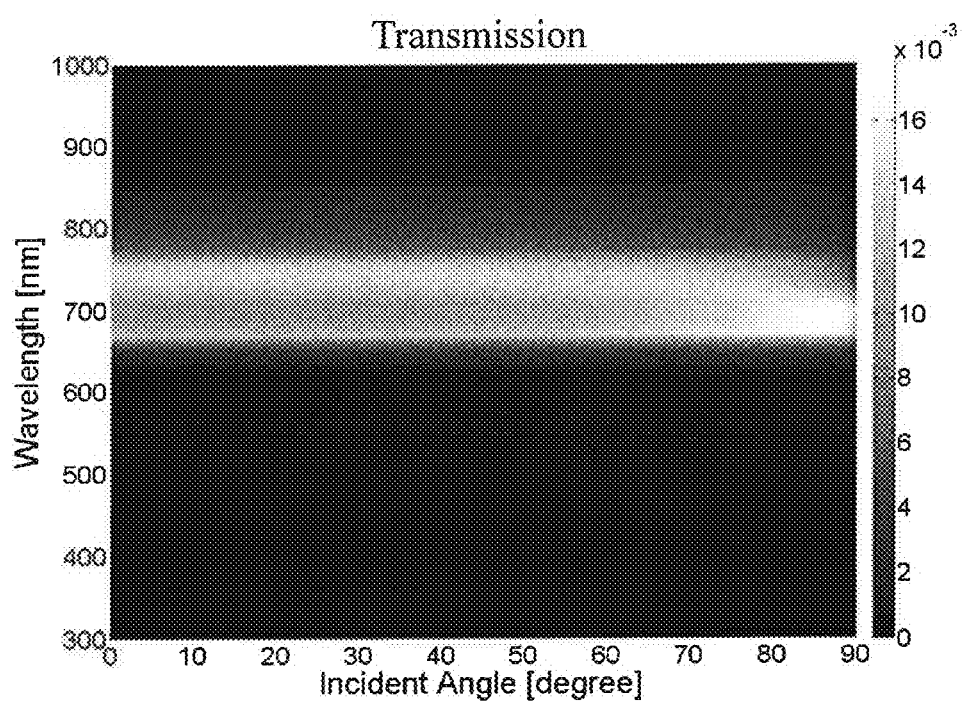
FIG. 5A shows the transmission of p-polarized light for different wavelengths and angles of incidence for a photonic bandgap solar cell according to some embodiments.

FIG. 5A shows transmission of p-polarized light for different wavelengths and angles of incidence for a photonic bandgap solar cell, according to some embodiments. For example, a solar cell according to embodiments consistent with FIG. 4A produces a transmission surface for p-polarized light as shown in FIG. 5A.

Figure 5B:
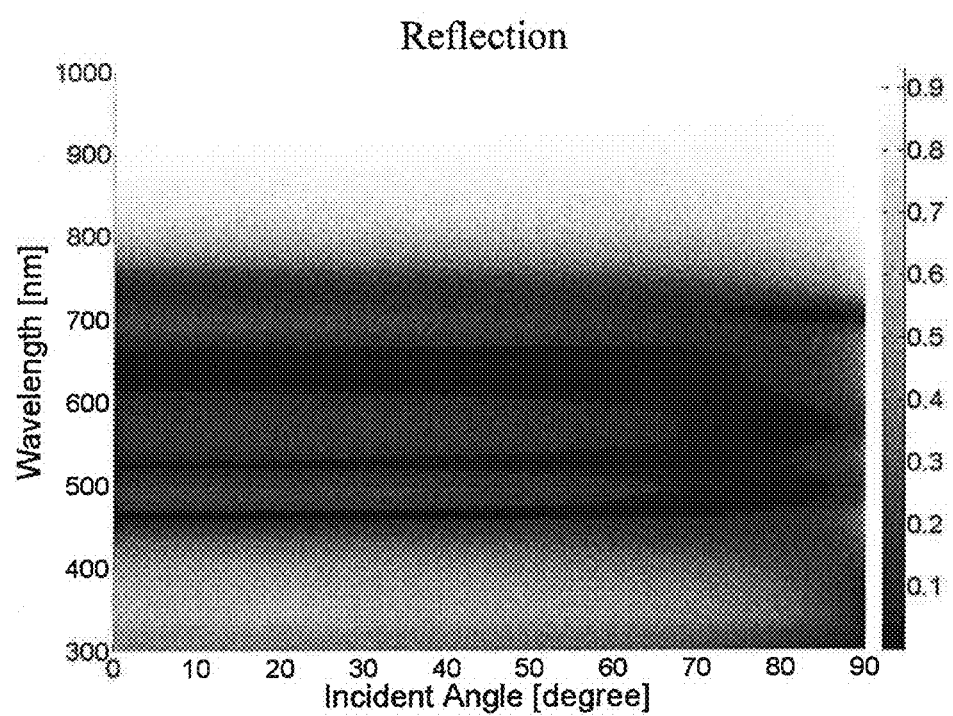
FIG. 5B shows the reflection of p-polarized light for different wavelengths and angles of incidence for a photonic bandgap solar cell according to some embodiments.

FIG. 5B shows the reflection of p-polarized light for different wavelengths and angles of incidence for a photonic bandgap solar cell, according to some embodiments. For example, a solar cell according to embodiments consistent with FIG. 4A produces a reflection surface for p-polarized light as shown in FIG. 5B.

Figure 5C:
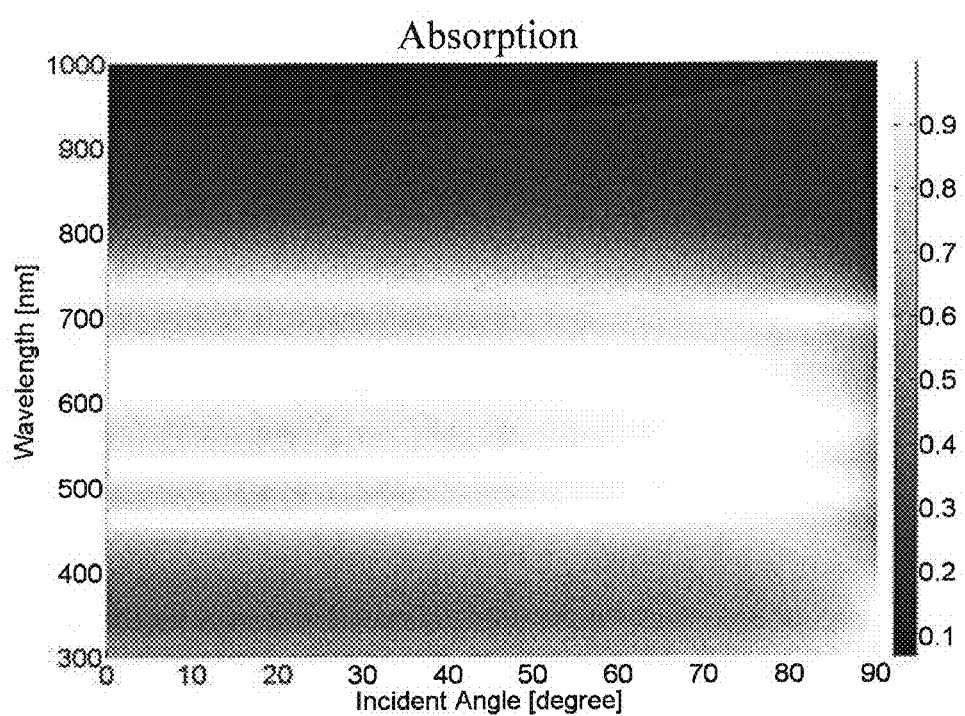
FIG. 5C shows the absorption of p-polarized light for different wavelengths and angles of incidence for a photonic bandgap solar cell according to some embodiments.
Figure 6A:
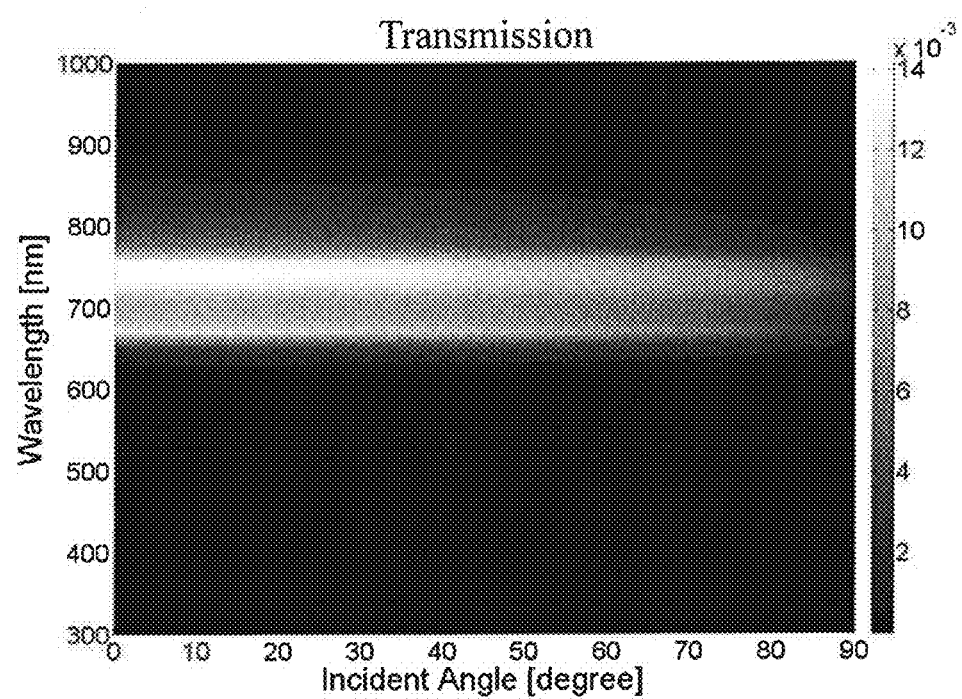
FIG. 6A shows the transmission of s-polarized light for different wavelengths and angles of incidence for a photonic bandgap solar cell according to some embodiments.
Figure 6B:
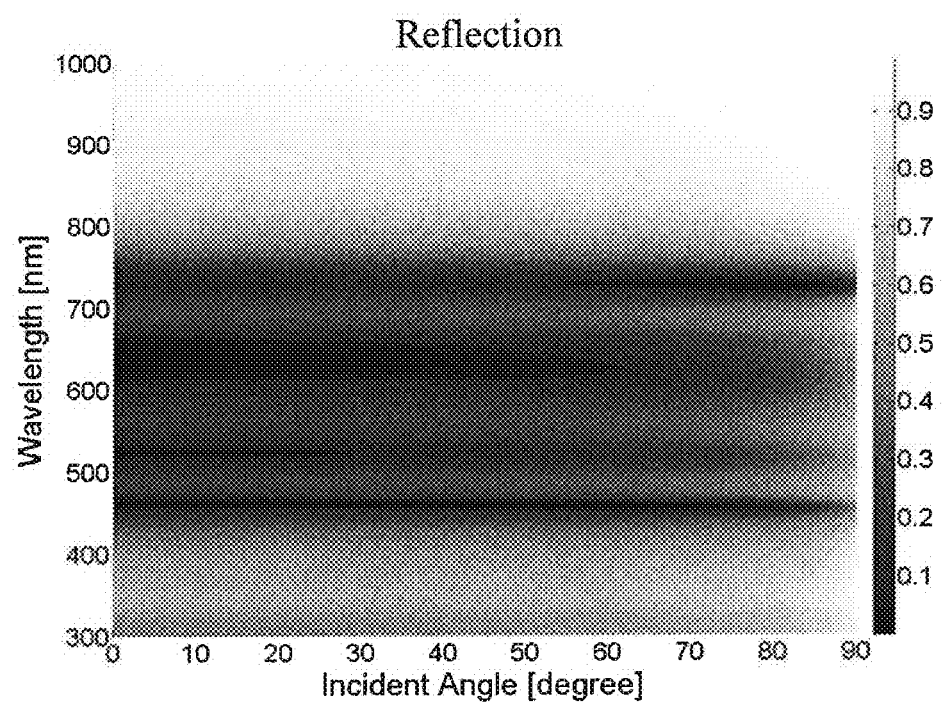
FIG. 6B shows the reflection of s-polarized light for different wavelengths and angles of incidence for a photonic bandgap solar cell according to some embodiments.
Figure 6C:
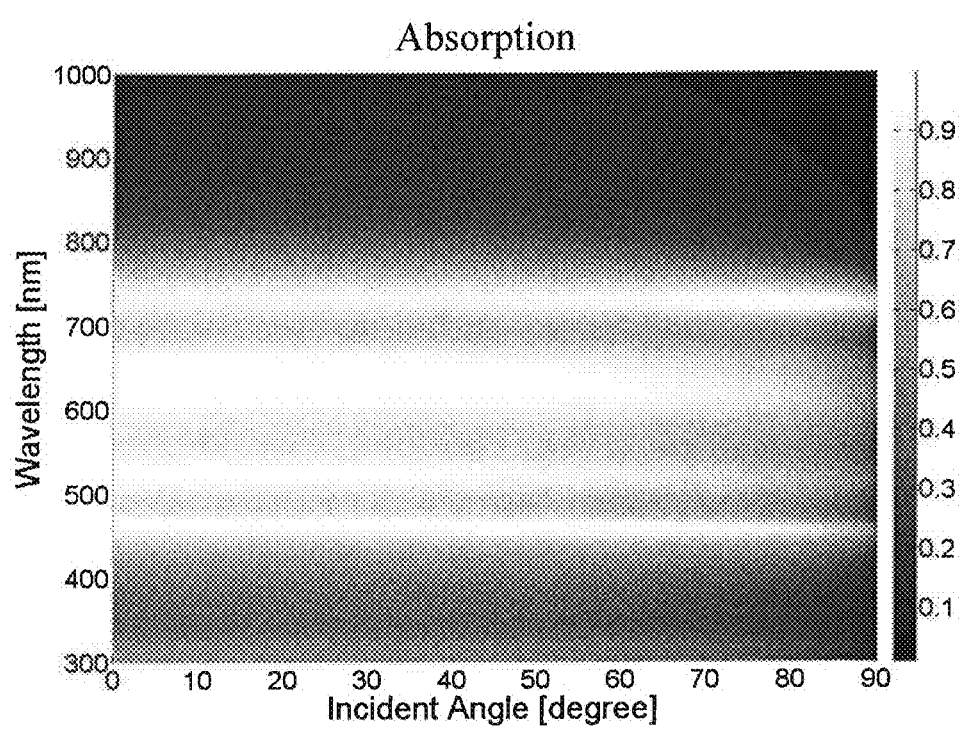
FIG. 6C shows the absorption of s-polarized light for different wavelengths and angles of incidence for a photonic bandgap solar cell according to some embodiments.

FIG. 5C shows the absorption of p-polarized light for different wavelengths and angles of incidence for a photonic bandgap solar cell, according to some embodiments. For example, a solar cell according to embodiments consistent with FIG. 4A produces an absorption surface for p-polarized light as shown in FIG. 5C.

FIG. 5A shows the transmission of s-polarized light for different wavelengths and angles of incidence for a photonic bandgap solar cell, according to some embodiments. For example, a solar cell according to embodiments consistent with FIG. 4A produces a transmission surface for s-polarized light as shown in FIG. 5A.

FIG. 5B shows the reflection of s-polarized light for different wavelengths and angles of incidence for a photonic bandgap solar cell, according to some embodiments. For example, a solar cell according to embodiments consistent with FIG. 4A produces a transmission surface for s-polarized light as shown in FIG. 5B.

Figure 7A:
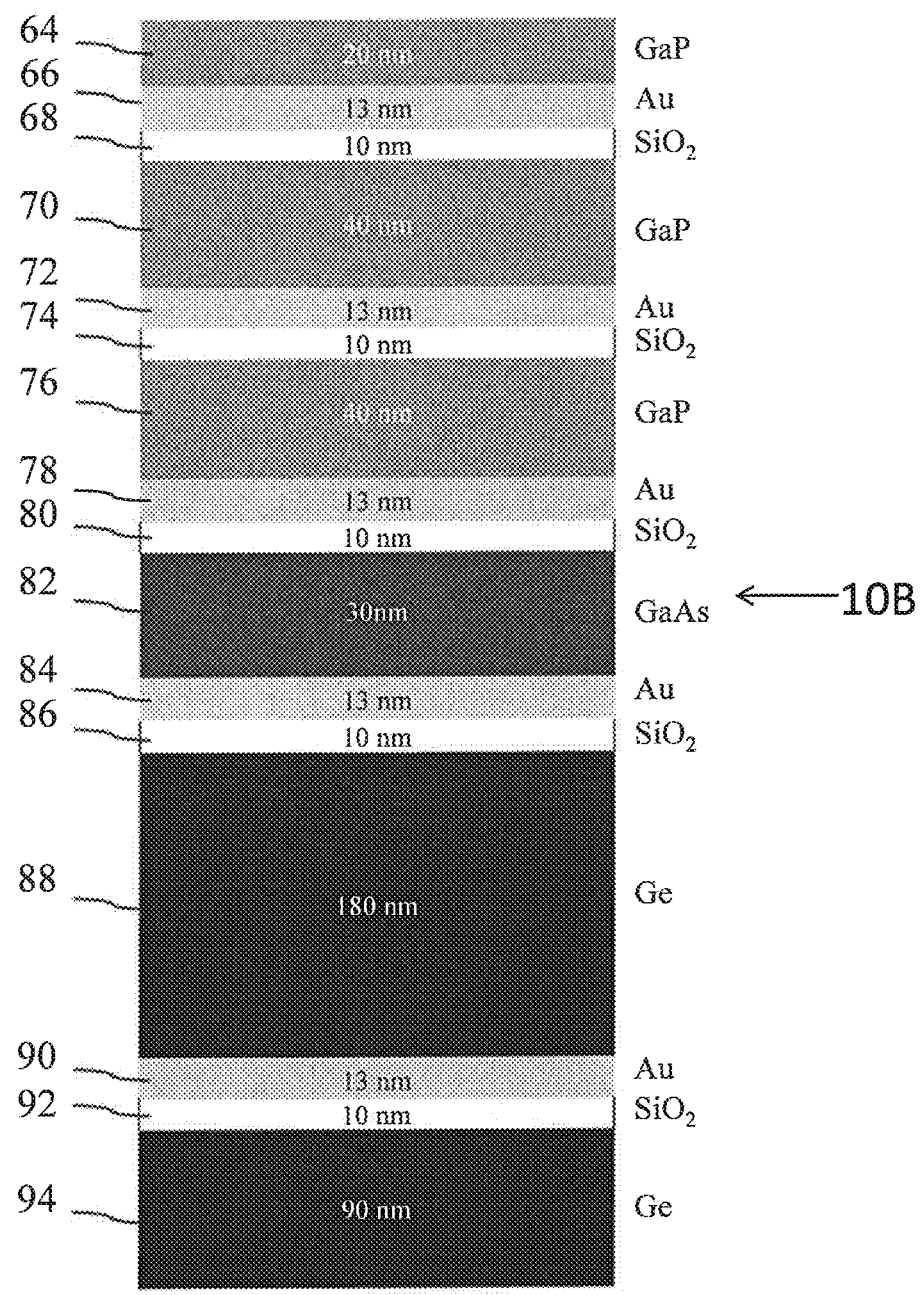
FIG. 7A shows a partial view of a photonic bandgap solar cell according to some embodiments.

FIG. 5C shows the absorption of s-polarized light for different wavelengths and angles of incidence for a photonic bandgap solar cell, according to some embodiments. For example, a solar cell according to embodiments consistent with FIG. 4A produces a transmission surface for s-polarized light as shown in FIG. 5C FIG. 7A shows a partial view of a photonic bandgap solar cell including SiO2 layers separating metal layers and semiconductor layers, according to some embodiments. The stack shown in FIG. 7A is similar to that of FIG. 4A, except for the inclusion of the SiO2 dielectric layers. The gold (Au) layer has been thinned to approximately 13 nm and associated with a SiO2 layer of approximately 10 nm in thickness. Each of the Ge layers have been thinned by 10%. Embodiments consistent with FIG. 7A have good electrical efficiency and comparable optical performance to structures consistent with FIG. 4A, as described in detail below in reference to FIG. 7B.

In FIG. 7A, the top layer of the photovoltaic cell 10B is a first semiconductor layer 64 made of GaP. First semiconductor layer 64 is 20 nm thick. Located below and contacting first semiconductor layer 64 is first metal conducting layer 66 made of gold (Au) and having a thickness of 13 nm. Located below and contacting first metal conducting layer 66 is a first dielectric layer 68 made of $SiO_2$ and having a thickness of 10 nm. Located below and contacting first dielectric layer 68 is second semiconductor layer 70 made of GaP and having a thickness of 40 nm. Located below and contacting second semiconductor layer 70 is a second metal conducting layer 72 made of gold and having a thickness of 13 nm.

Located below and contacting second metal conducting layer 72 is a second dielectric layer 74 made of $SiO_2$ and having a thickness of 10 nm. (FIG. 7A) Located below and contacting second dielectric layer 74 is a third semiconductor layer 76 made of GaP and having a thickness of 40 nm. Located below and contacting third semiconductor layer 76 is a third metal conducting layer 78 made of gold and having a thickness of 13 nm. Located below and contacting third metal conducting layer 78 is a third dielectric layer 80 made of $SiO_2$ and having a thickness of 10 nm. Located below and contacting third dielectric layer 80 is a fourth semiconductor layer 82 made of GaAs and having a thickness of 30 nm. Located below and contacting fourth semiconductor layer 82 is a fourth metal conducting layer 84 made of gold and having a thickness of 13 nm. Located below and contacting the fourth metal conducting layer 84 is a fourth dielectric layer 86 made of $SiO_2$ and having a thickness of 10 nm.

Located below and contacting fourth dielectric layer 86 is a fifth semiconductor layer 88 made of Ge having a thickness of 180 nm. (FIG. 7A) Located below and contacting the fifth semiconductor layer 88 is a fifth metal conducting layer 90 made of gold and having a thickness of 13 nm. Located below and contacting the fifth metal conducting layer 90 is a fifth dielectric layer 92 made of $SiO_2$ and having a thickness of 10 nm. Located below and contacting the fifth dielectric layer 92 is a bottom layer of the photovoltaic cell 10B. The bottom layer is a sixth semiconductor layer 94 made of Ge and having a thickness of 90 nm.

Figure 7B:
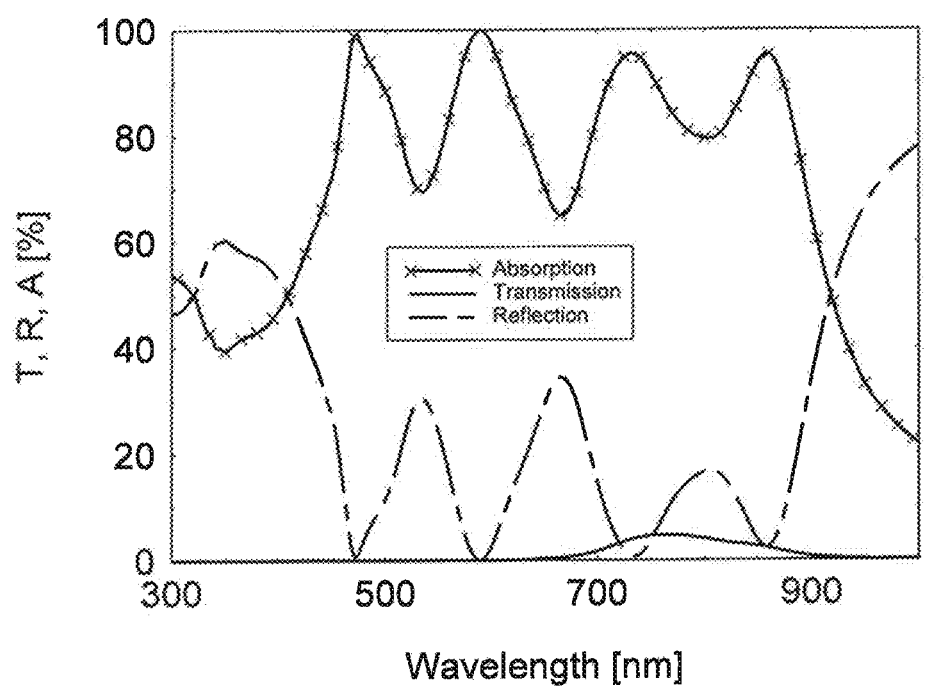
FIG. 7B shows the transmission, reflection, and absorption of light at normal incidence for a photonic bandgap solar cell according to some embodiments.

FIG. 7B shows the transmission, reflection, and absorption of light at normal incidence for a photonic bandgap cell consistent with FIG. 7A. FIG. 7B shows a similar optical performance to structures consistent with FIG. 4A (cf. FIG. 4B). Furthermore, structures consistent with FIG. 7A have a high conversion efficiency due to the formation of a thicker depletion region in the semiconductor layer next to the SiO2 layer. In particular, in a configuration consistent with FIG. 7A the multilayer film is approximately 515 nm thick and exhibits an optical response similar to the structure in FIG. 4A (cf. FIG. 7B and FIG. 4B). Transmission in this case is a bit higher and the average absorption values are approximately 85% (corresponding to an average absorption in semiconductor layers of ~60%) across the entire range disclosed (cf. FIG. 7B). While the optical response is only slightly affected by the SiO2 layers, the electrical behavior of the cell benefits from the presence of insulator layers at each metal-semiconductor junction. With a SiO2 layer separating a semiconductor from a metal layer, the structure can sustain higher open-circuit voltages and keep virtually the same short circuit currents.

Figure 8:
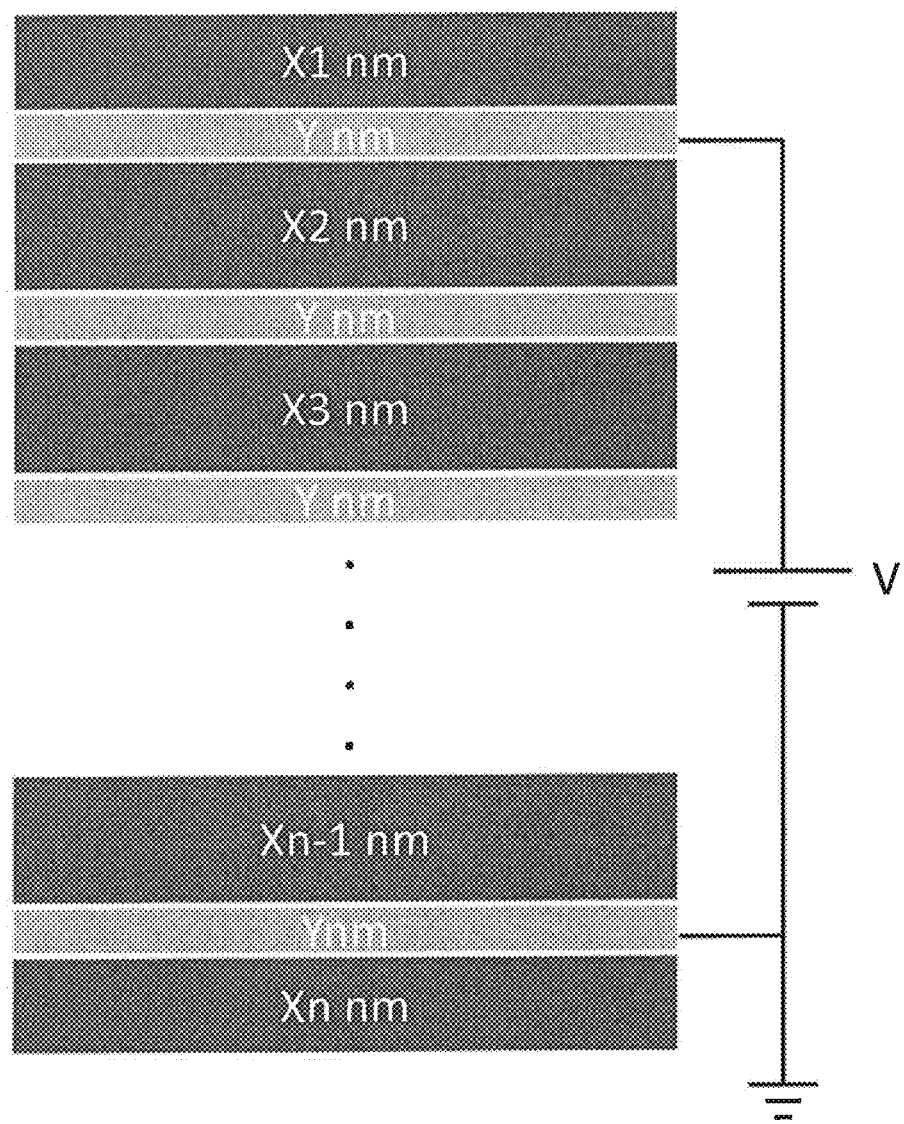
FIG. 8 shows a partial view of an electrical connection for a photonic bandgap solar cell according to some embodiments.

FIG. 8 shows a partial view of an electrical connection for a photonic bandgap solar cell according to some embodiments. Layers X1 through Xn may be appropriately doped semiconductor layers, and layers Y may be metal layers. According to embodiments consistent with FIG. 8, layers X1 through Xn may include different semiconductor materials and have different thicknesses. Layers Y may include the same metal component and have the same or different thicknesses. According to embodiments consistent with FIG. 8 a direct voltage (DC) V may be applied between two separate metal layers in a stack.

For example, the first metal layer may be placed at a high voltage and the bottom layer may be grounded, as illustrated in FIG. 8. In such configuration, a potential difference is established across the stack such that each metal layer in between the top layer and the bottom layer is at a different voltage value lower than V and higher than ground. Thus, the metal layers in FIG. 8 are coupled in series. Each semiconductor layer Xi is placed between two metal layers Y at different voltages. As a result, when an incoming photon generates charge carriers such as an electron-hole pair in layer Xi, the positive charge carriers are separated from the negative charge carriers and driven into the metal layers from where they may be collected. Some embodiments consistent with the arrangement of FIG. 8 may have the top metal layer Y connected to ground, and the bottom metal layer Y connected to a higher DC voltage V.

Figure 9:
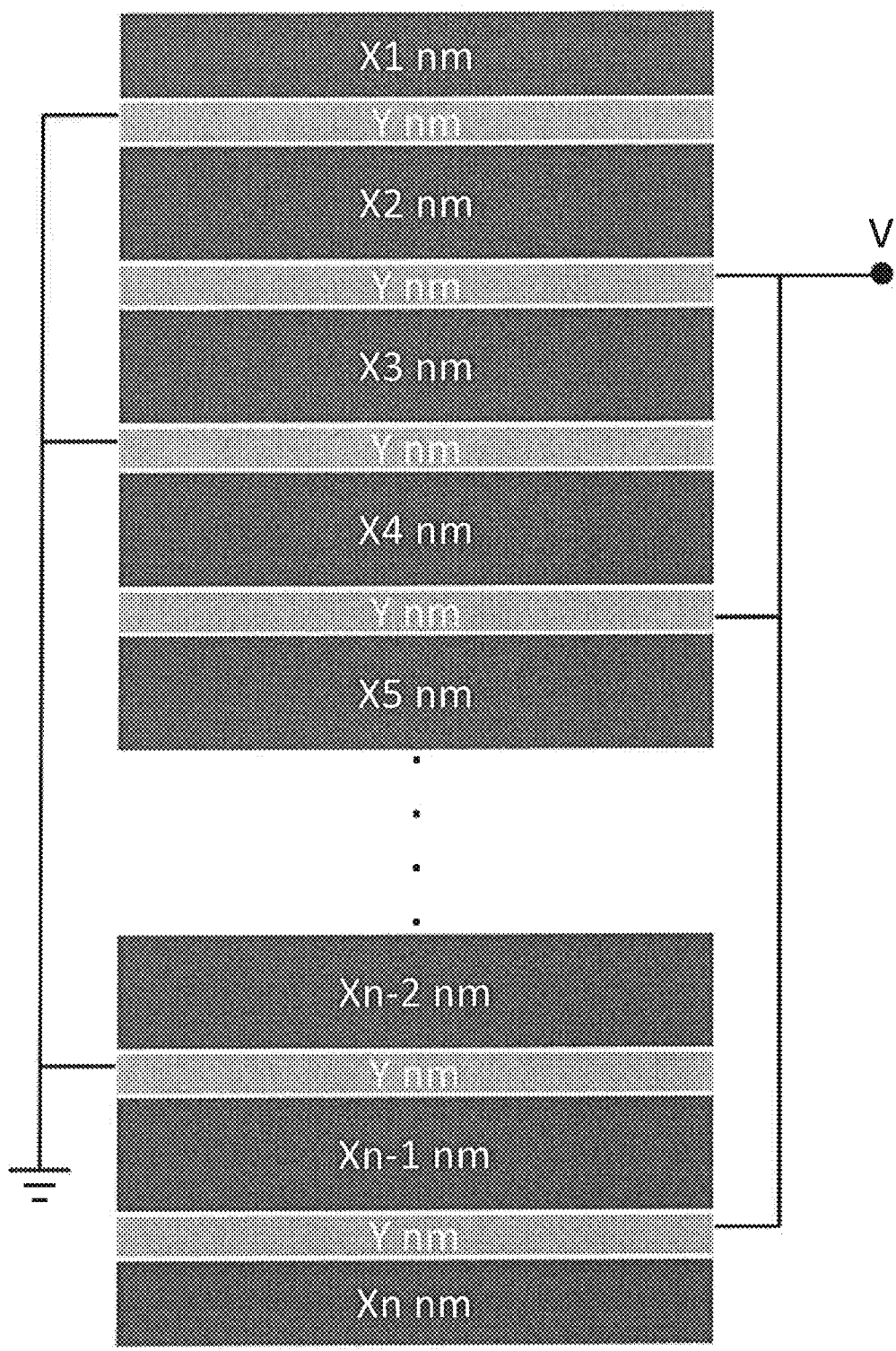
FIG. 9 shows a partial view of an electrical connection for a photonic bandgap solar cell according to some embodiments.

FIG. 9 shows a partial view of an electrical connection for a photonic bandgap solar cell according to some embodiments. In FIG. 9, metal layers Y are connected in parallel, by pairs, such that each semiconductor layer Xi is sandwiched between a metal layer Y at a high DC voltage V, and a metal layer Y connected to ground. The effect on the semiconductor layer Xi is the same as described above in relation to FIG. 8.

Thus, a photo-generated charged carrier pair within the semiconductor is split so that charges of opposite sign travel to opposite metal layers Y, where they are collected away from the stack.

In the range of optical and near IR wavelengths, conductors such as gold and silver have a dielectric constant with a negative real part. Semiconductors, on the other hand, have positive dielectric constants. In the present invention, this abrupt contrast of dielectric constants allows for multiple internal reflections and triggers interference effects so as to induce the formation of a photonic band structure.

At 300° K, gallium arsenide (GaAs) has a static dielectric constant of 12.9 and a high frequency dielectric constant of 10.89. At 300° K., gallium phosphide (GaP) has a static dielectric constant of 11.1 and a high frequency dielectric constant of 16.2. At 300° K, germanium (Ge) has a dielectric constant of 16.2.

The real part of the dielectric constant for gold at optical frequencies is negative. For example, at an optical wavelength of 0.5876 micrometers (which is within the range of visible light), the real part of the dielectric constant $\epsilon_1$ for gold is −8.4953 ($\epsilon_1$=−8.4593) and the imaginary part of the dielectric constant $\epsilon_2$ for gold is 1.6239 ($\epsilon_2$=1.6239). The real part of the dielectric constant for silver at optical frequencies is negative. For example, at an optical wavelength of 0.5876 micrometers, the real part of the dielectric constant $\epsilon_1$ for silver is −15.243 ($\epsilon_1$=−15.243) and the imaginary part of the dielectric constant $\epsilon_2$ for silver is 0.40284 ($\epsilon_2$=0.40284).

What is claimed is:

1. A photonic bandgap structure, comprising:
a first layer of Gallium Phosphide (GaP);
a layer of Gallium Arsenide (GaAs);
a first conductive layer located between said first layer of Gallium Phosphide and said layer of Gallium Arsenide, with the distance from a top surface of said first layer of Gallium Phosphide to a bottom surface of said layer of Gallium Arsenide being less than 200 nanometers;
a second conductive layer;
a second layer of Gallium Phosphide, with said second layer of Gallium Phosphide lying between said first conductive layer and said second conductive layer, said first conductive layer being in direct contact with said first layer of Gallium Phosphide;
a third conductive layer and a fourth conductive layer;
a third layer made of Gallium Phosphide with said third layer of Gallium Phosphide lying between said second conductive layer and said third conductive layer and said layer of Gallium Arsenide lying between said third conductive layer and said fourth conductive layer;
a fifth conductive layer;
a first layer of Germanium, with said first layer of Germanium lying between said fourth conductive layer and said fifth conductive layer;
a second layer of Germanium located below and connecting to said fifth conductive layer; said fifth conductive layer being located below and connecting to said first layer of Germanium; said first layer of Germanium being located below and connecting to said fourth conductive layer; said fourth conductive layer being located below and directly connecting to said layer of Gallium Arsenide; said third conductive layer being located below and connecting to said third layer of Gallium Phosphide; said third layer of Gallium Phosphide being located below and connecting to said second conductive layer; said second conductive layer being located below and directly connecting to said second layer of Gallium Phosphide; said second layer of Gallium Phosphide being located below and connecting to said first conductive layer, and said first conductive layer directly connecting to said first layer of Gallium Phosphide; and wherein:
said first, said second, said third, said fourth, and said fifth conductive layers have real dielectric constants which are less than zero; and a total thickness from a top surface to a bottom surface of said photonic bandgap structure is less than one micron.

2. A photonic bandgap structure according to claim 1, wherein:
from a bottom surface of said second layer of Germanium to said top surface of said first layer of Gallium Phosphide is a distance less than 520 nanometers; and
said first, said second, said third, said fourth and said fifth conductive layers are approximately 15 nanometers thick.

3. A photonic bandgap structure according to claim 1, further comprising:
a first buffer layer, a second buffer layer, a third buffer layer and a fourth buffer layer;
said first buffer layer making direct contact with said first conductive layer and making direct contact with said second layer of Gallium Phosphide;
said second buffer layer making direct contact with said second conductive layer and making direct contact with said third layer of Gallium Phosphide;
said third buffer layer making direct contact with said third conductive layer and making direct contact with said layer of Gallium Arsenide; and
said fourth buffer layer making direct contact with said fourth conductive layer and making direct contact with said first layer of Germanium.

4. A photonic bandgap structure, comprising:
a first layer of Gallium Phosphide (GaP);
a first layer of Gallium Arsenide (GaAs);
a first conductive layer located between said first layer of Gallium Phosphide and said first layer of Gallium Arsenide, with the distance from a top surface of said first layer of Gallium Phosphide to a bottom surface of said first layer of Gallium Arsenide being less than 200 nanometers;
a second conductive layer;
a second layer of Gallium Phosphide, with said second layer of Gallium Phosphide lying between said first conductive layer and said second conductive layer, said first conductive layer being in direct contact with said first layer of Gallium Phosphide;
a third conductive layer and a fourth conductive layer;
a third layer of Gallium Phosphide with said third layer of Gallium Phosphide lying between said second conductive layer and said third conductive layer and said first layer of Gallium Arsenide lying between said third conductive layer and said fourth conductive layer;
a second layer of Gallium Arsenide directly connecting to said fourth conductive layer;
a fifth conductive layer directly connected to said second layer of Gallium Arsenide;
a third layer of Gallium Arsenide directly connected to said fifth conductive layer;
a fourth layer of Gallium Arsenide;
a sixth conductive layer directly connected to said fourth layer of Gallium Arsenide;
a seventh conductive layer directly connected to said fourth layer of Gallium Arsenide;
a fifth layer of Gallium Arsenide directly connected to said seventh conductive layer, with the distance from a bottom surface of said fifth layer of Gallium Arsenide to said top surface of said first layer of Gallium Phosphide being less than one micron; and wherein:
said first, said second, said third, said fourth, said fifth, said sixth and said seventh conductive layers have real dielectric constants which are less than zero.

5. A photonic bandgap structure, according to claim 4, wherein:
said first, said second, said third, said fourth, said fifth, said sixth and said seventh conductive layers are made of Silver.

6. A photonic bandgap structure having stacked layers, comprising:
a top surface and a bottom surface with a distance from said top surface to said bottom surface being less than one micron;
a plurality of layers of Gallium Phosphide (GaP) which include a first layer, a second layer and a third layer of Gallium Phosphide, said first layer of Gallium Phosphide having a top surface which is said top surface of the photonic bandgap structure;
a plurality of upper conductive layers with a first layer of said upper conductive layers being positioned between said first and said second layers of said plurality of layers of Gallium Phosphide, said third layer of Gallium Phosphide being positioned between a second layer and a third layer of said upper conductive layers;
a layer of Gallium Arsenide (GaAs) positioned below said third conductive layer of said plurality of upper conductive layers and being connected to said plurality of layers of Gallium Phosphide;
a first layer of Germanium (Ge) positioned below said layer of Gallium Arsenide;
a plurality of lower conductive layers with a first layer of said plurality of lower conductive layers being located between said layer of Gallium Arsenide and said first layer of Germanium;
a second layer of Germanium located below said first layer of Germanium;
a second layer of said plurality of lower conductive layers positioned between said first layer of Germanium and said second layer of Germanium, with said second layer of Germanium having a bottom surface which is said bottom surface of said photonic bandgap structure.

7. A photonic bandgap structure according to claim 6, wherein:
said plurality of upper conductive layers and said plurality of lower conductive layers are made of gold.

8. A photonic bandgap structure according to claim 6 further comprising:
a first buffer layer, a second buffer layer, a third buffer layer and a fourth buffer layer; and wherein:
said first buffer layer makes direct contact with said second layer of Gallium Phosphide;
said second buffer layer makes direct contact with said third layer of Gallium Phosphide;
said third buffer layer makes direct contact with said layer of Gallium Arsenide; and
said fourth buffer layer makes direct contact with said first layer of Germanium.

* * * * *